United States Patent
Marchant et al.

(10) Patent No.: US 7,485,532 B2
(45) Date of Patent: Feb. 3, 2009

(54) METHOD OF FORMING TRENCH GATE FETS WITH REDUCED GATE TO DRAIN CHARGE

(75) Inventors: Bruce D. Marchant, Murray, UT (US); Ashok Challa, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 12/052,135

(22) Filed: Mar. 20, 2008

(65) Prior Publication Data

US 2008/0166846 A1 Jul. 10, 2008

Related U.S. Application Data

(62) Division of application No. 11/116,106, filed on Apr. 26, 2005, now Pat. No. 7,382,019.

(51) Int. Cl.
*H01L 21/336* (2006.01)
(52) U.S. Cl. .................. 438/259; 438/270; 438/271
(58) Field of Classification Search ............... 438/206, 438/217, 259, 270, 271, 276, 289
See application file for complete search history.

(56) References Cited

U.S. PATENT DOCUMENTS

| | | | |
|---|---|---|---|
| 5,576,245 A * | 11/1996 | Cogan et al. ............... | 438/270 |
| 5,637,898 A | 6/1997 | Baliga | |
| 6,365,462 B2 | 4/2002 | Baliga | |
| 6,437,386 B1 | 8/2002 | Hurst et al. | |
| 6,809,375 B2 * | 10/2004 | Takemori et al. ............ | 257/330 |
| 7,091,573 B2 | 8/2006 | Hirler et al. | |
| 2005/0116267 A1 * | 6/2005 | Zundel et al. ............... | 257/288 |

OTHER PUBLICATIONS

Non-Final Office Action mailed May 4, 2007 in U.S. Appl. No. 11/116,106.
Notice of Allowance mailed Oct. 10, 2007 in U.S. Appl. No. 11/116,106.
Notice of Allowance mailed Mar. 18, 2008 in U.S. Appl. No. 11/116,106.

* cited by examiner

*Primary Examiner*—Thien F Tran
(74) *Attorney, Agent, or Firm*—Townsend and Townsend and Crew LLP

(57) ABSTRACT

A method for forming a FET includes the following steps. Trenches are formed in a semiconductor region of a first conductivity type. A well region of a second conductivity type is formed in the semiconductor region. Source regions of the first conductivity type are formed in the well region such that channel regions defined by a spacing between the source regions and a bottom surface of the well region are formed in the well region along opposing sidewalls of the trenches. A gate dielectric layer having a non-uniform thickness is formed along the opposing sidewalls of the trenches such that a variation in thickness of the gate dielectric layer along at least a lower portion of the channel regions is: (i) substantially linear, and (ii) inversely dependent on a variation in doping concentration in the lower portion of the channel regions. A gate electrode is formed in each trench.

19 Claims, 5 Drawing Sheets

METHOD OF FORMING TRENCH GATE FETS WITH REDUCED GATE TO DRAIN CHARGE

CROSS-REFERENCES TO RELATED APPLICATIONS

This application is a divisional of U.S. application Ser. No. 11/116,106, filed Apr. 26, 2005, which is incorporated herein by reference in its entirety for all purposes.

BACKGROUND OF THE INVENTION

The invention relates to semiconductor power devices and more particularly to a structure and method for forming a trench gate field effect transistors (FETs) with reduced gate to drain charge (Qgd).

Power FETs are used in such applications as DC-DC converters. A key parameter in achieving a high efficiency DC-DC converter is the gate to drain charge (Qgd) of the FETs used in the converter. A known method for reducing Qgd is to use a thick bottom oxide (TBO) below the trench gate electrode. This is more clearly shown in FIG. 1A.

FIG. 1A is a simplified cross-section view of a conventional n-channel trench gate vertical MOSFET. As shown, a trench 101 extends through n-type source regions 106 and p-type well region 104, and terminates within n-type drift region 102. An n-type substrate (not shown) extends below drift region 102. Typically, source regions 106 and well region 104 are formed in an n-type epitaxial layer which would also encompass drift region 102. Such epitaxial layer would normally be formed over the substrate. Trench 101 includes a thick insulator 108 along its bottom, a gate insulator 110 along its sidewalls, a recessed gate electrode 112 (typically from polysilicon), and an insulating layer 114 atop the gate electrode 112. A source metal (not shown) contacts source regions 106 and well region 104 along the top-side, and a drain metal (not shown) contacts the substrate along the bottom surface of the structure.

While the thick bottom insulator 108 helps reduce Qgd, this parameter (Qgd) still remains a significant factor in performance of such applications as DC-DC converters. Thus, techniques for further reducing Qgd are desirable.

BRIEF SUMMARY OF THE INVENTION

In accordance with an embodiment of the invention, a method for forming a FET includes the following steps. Trenches are formed in a semiconductor region of a first conductivity type. A well region of a second conductivity type is formed in the semiconductor region. Source regions of the first conductivity type are formed in the well region such that channel regions defined by a spacing between the source regions and a bottom surface of the well region are formed in the well region along opposing sidewalls of the trenches. A gate dielectric layer having a non-uniform thickness is formed along the opposing sidewalls of the trenches such that a variation in thickness of the gate dielectric layer along at least a lower portion of the channel regions is: (i) substantially linear, and (ii) inversely dependent on a variation in doping concentration in the lower portion of the channel regions. A gate electrode is formed in each trench.

In one embodiment, the variation in thickness of the gate dielectric layer is such that a conduction channel is formed in each channel region when the field effect transistor is in the on state.

In another embodiment, the variation in thickness of the gate dielectric layer does not increase a threshold voltage of the field effect transistor.

In another embodiment, the step of forming a gate dielectric layer includes the following steps. A first insulating layer is formed along the opposing sidewalls of the trenches. Each trench is filled with a fill material having a higher etch rate than the first insulating layer. The fill material and the first insulating layer are simultaneously etched such that: (i) an upper portion of the first insulating layer is completely removed from along an upper portion of the opposing sidewalls of the trenches and a remaining lower portion of the first insulating layer has a tapered edge, and (ii) a portion of the fill material remains in each trench. A second insulating layer is formed at least along upper portions of the opposing sidewalls of the trenches where the first insulating layer is completely removed.

In accordance with another embodiment of the invention, a method for forming a field effect transistor includes the following steps. Trenches are formed in a semiconductor region of a first conductivity type. A first insulating layer is formed along opposing sidewalls of each trench. Each trench is filled with a dielectric fill material having a higher etch rate than the first insulating layer. The dielectric fill material and the first insulating layer are simultaneously etched such that: (i) an upper portion of the first insulating layer is completely removed from along an upper portion of the opposing sidewall of each trench and a remaining lower portion of the first insulating layer has a tapered edge, and (ii) a portion of the dielectric fill material remains in each trench. A second insulating layer is formed at least along upper portions of the opposing sidewalls of each trench where the first dielectric layer was completely removed.

In one embodiment, the method further includes the following steps. A gate electrode is formed in each trench over the remaining dielectric fill material. A well region of a second conductivity type is formed in the semiconductor region. Source regions of the first conductivity type are formed in the well region.

DETAILED DESCRIPTION OF THE INVENTION

In accordance with the present invention, a substantial reduction in the gate-drain charge (Qgd) of a trench gate vertical FET is obtained by using a tapered gate insulator along at least a lower portion of the channel region of the FET.

It was observed that in trench gate structures with a thick bottom insulator, the primary contributor to the device Qgd was the gate to drain charge along the trench sidewalls. In FIG. 1A, spacing X represents the distance between the bottom of well region 104 and bottom of gate electrode 112.

Modeling results indicated that varying spacing X by ±0.15 µm caused Qgd to vary by a factor of 2.5. This led to investigation of techniques for reducing the Qgd along the trench sidewalls.

Figure 1B:
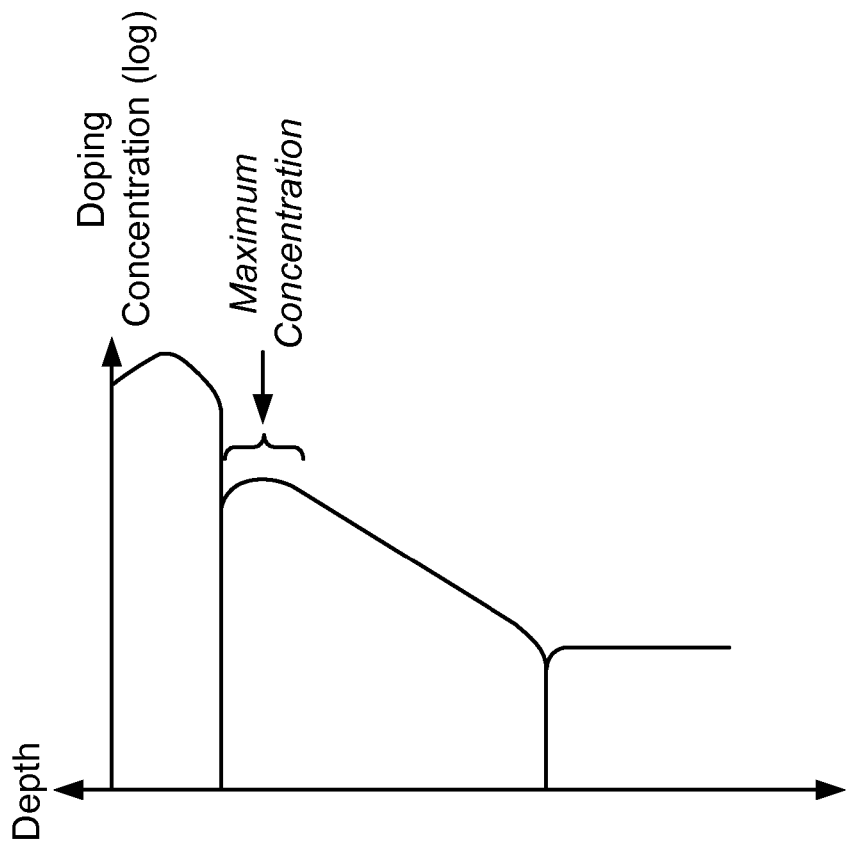
FIG. 1B shows a typical profile of the doping concentration through various silicon regions along line 1B-1B in FIG. 1A.
Figure 1A:
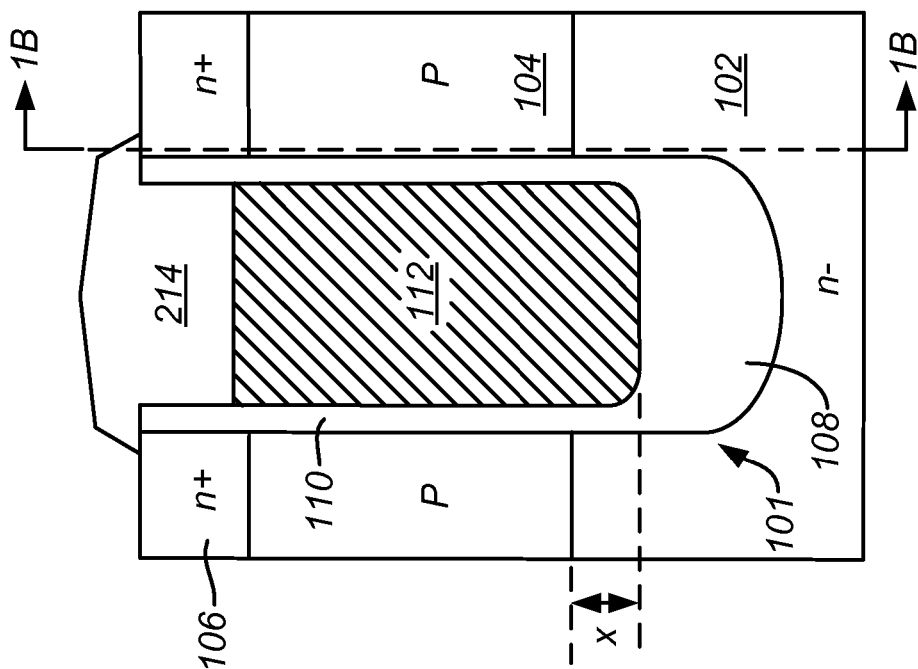
FIG. 1A is a simplified cross-section view of a conventional n-channel trench gate vertical MOSFET with thick bottom insulator.

FIG. 1B shows a typical profile of the doping concentration through various silicon regions along line 1B-1B in FIG. 1A. As shown in FIG. 1B, due to the diffused doping through the channel region along the trench sidewall, the doping concentration near the top of the channel is at a maximum concentration and decreases significantly in the direction toward the bottom of the channel region. The threshold voltage (Vth) of the FET is in part determined by the maximum doping concentration in the channel region since that is the last point in the channel that would invert as the FET bias voltage increases toward the on state. All other locations along the channel region invert at a lower voltage.

In accordance with an embodiment of the invention, the thickness of the gate insulator along the trench sidewalls of a trench gate FET is varied inversely with the doping concentration along the channel region. That is, the gate insulator has a "normal" uniform thickness along an upper portion of the channel region where the doping concentration in the channel region is near its maximum. Along the lower portion of the channel region, the gate insulator thickness increases linearly from the "normal" thickness at a rate corresponding to the rate at which the doping concentration in the channel region drops. As an example, the gate insulator along the upper portion of the channel region where the doping concentration is near the maximum would be about 400 Å, and along the lower portion of the channel region, the gate insulator thickness increases linearly from 400 Å to about a 1000 Å near the bottom of the gate electrode.

As the thickness of the gate insulator increases along the lower portion of the channel region, the threshold voltage along the channel region (Vth(x)) increases. However, the corresponding reduction in the doping concentration along the channel region compensates for this increase in Vth(x), thus preventing the overall Vth of the FET from increasing. Therefore, by controlling the rate at which the thickness of the gate insulator changes along the lower portion of the channel region, the Vth(x) can be kept below the peak Vth in the maximum doping concentration region. This technique results in a substantial increase in the thickness of the gate insulator along the lower portion of the trench sidewalls where Qgd is highest, without adversely impacting the Vth. For example, in FIG. 1A, if the thickness of the gate insulator 110 along the spacing X is 1000 Å instead of the conventional 400 Å, then the absolute value of Qgd would be reduced by 60% (Qgd×(400/1000)). The impact of the increased gate insulator thickness on the on-resistance of the FET has been observed to be relatively small.

Figure 2:
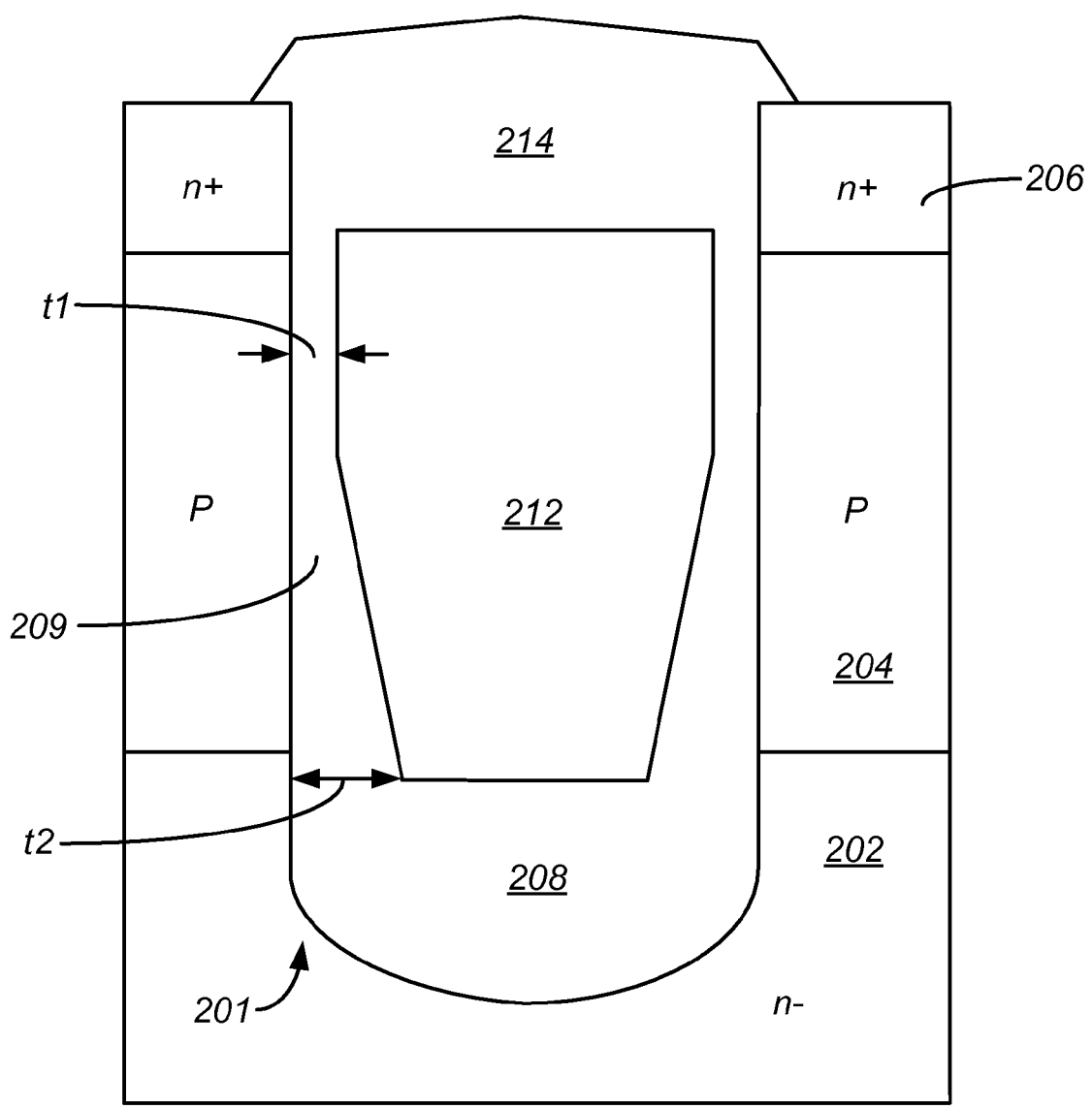
FIG. 2 shows a simplified cross section view of an n-channel trench gate vertical MOSFET in accordance with an embodiment of the invention.

FIG. 2 shows a simplified cross section view of an n-channel trench gate vertical MOSFET in accordance with an embodiment of the invention. As shown, a trench 201 extends through n-type source regions 206 and p-type well region 204, and terminates within n-type drift region 202. An n-type substrate (not shown) extends below drift region 202. In one embodiment, source regions 206 and well region 204 are formed in an n-type epitaxial layer which would also encompass drift region 202. Such epitaxial layer would be formed over the substrate. Trench 201 includes a gate insulator 209 lining the trench sidewalls. A relatively thick insulator 208 fills a bottom portion of trench 201. A recessed gate electrode 212 fills the trench over the thick bottom insulator 208. An insulating layer 214 is formed atop gate electrode 212. A source metal (not shown) contacts source regions 206 and well region 204 along the top-side, and a drain metal (not shown) contacts the substrate along the bottom surface of the structure.

As is well known in this art, when the MOSFET is biased in the on state, current flows vertically through a channel region formed along the trench sidewalls in well region 209. The channel regions thus extend along the trench sidewalls from the bottom surface of source regions 206 to the bottom surface of well region 204. As shown in FIG. 2, gate insulator 209 has a uniform thickness t1 along an upper portion of the channel region, and a non-uniform thickness along a bottom portion of the channel region.

The point at which gate insulator 209 transitions from the uniform thickness t1 to the non-uniform thickness is determined by the doping profile along the channel region. The upper portion of gate insulator 209 which has a uniform thickness t1 roughly corresponds to what is identified in FIG. 1B as the "maximum concentration" region. That is, the thickness of gate insulator 209 along the portion of the channel region where the doping concentration is near its maximum is maintained at a predetermined value t1 corresponding to a desired threshold voltage (e.g., 1.5V). The rate at which gate insulator 209 increases in thickness along the lower portion of gate insulator 209 is dependent on the rate at which the doping concentration in the corresponding portion of the channel region decreases such that the overall threshold voltage remains at the desired value (e.g., 1.5V). In this manner, the component of Qgd along the lower portions of the trench sidewalls is substantially reduced without adversely impacting the threshold voltage or other device parameters.

The table below shows process and device modeling results for three FET devices. Various parameters for a conventional FET (identified in the table as STD) and two FETs (options 1 and 2) in accordance with exemplary embodiments of the invention are tabulated. The conventional FET has a uniform gate oxide thickness of 400 Å. Option 1 corresponds to the case where the gate oxide tapers from a uniform thickness t1=400 Å along an upper portion of the channel region to a thickness t2=970 Å at the bottom of gate electrode 212 over a vertical distance of 0.19 µm. Option 2 corresponds to the case where the gate oxide tapers from a uniform thickness t1=400 Å to a thickness t2=1400 Å over a vertical distance of 0.47 µm.

|  |  | STD | Option 1 | Option 2 |
| --- | --- | --- | --- | --- |
| Taper | µm | 0 | 0.19 | 0.47 |
| Gate Oxide | Å | 400 | 970 | 1400 |
| Qgd | nC/cm$^2$ | 193 | 158 | 118 |
| Rsp (10 V) | mΩ · cm$^2$ | 0.137 | 0.141 | 0.148 |
| Rsp (4.5 V) | mΩ · cm$^2$ | 0.178 | 0.186 | 0.210 |
| Bvdss | V | 30.9 | 32.8 | 34.2 |
| Vth | V | 1.55 | 1.55 | 1.55 |

As can be seen, the FETs corresponding to options 1 and 2 respectively yield a reduction of about 20% and 40% in Qgd relative to the conventional FET, while Vth is maintained at 1.55V and the on-resistance (Rsp) is increased only slightly.

Figure 3A:
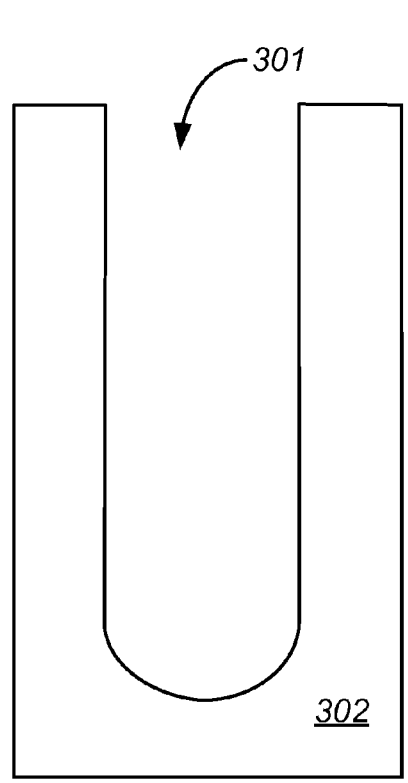
FIGS. 3A-3F show cross section views at various stages of a manufacturing process for forming the MOSFET in FIG. 2 in accordance with an embodiment of the invention.
Figure 3B:
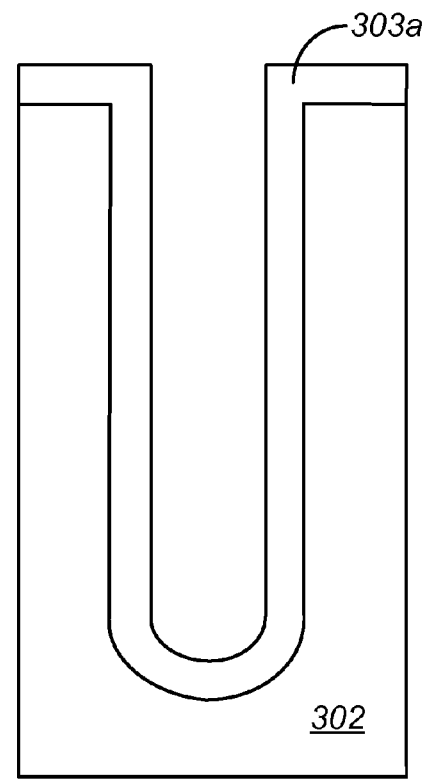

FIGS. 3A-3F show cross section views at various stages of a manufacturing process for forming the MOSFET in FIG. 2, in accordance with an embodiment of the invention. In FIG. 3A, a trench 301 is formed in an n-type epitaxial layer 302 using conventional techniques. Epitaxial layer extends over a substrate (not shown). In FIG. 3B, a layer of insulating material 303a is formed over the exposed silicon surfaces (including along the trench sidewalls and bottom) using for example a thermal oxidation process or by deposition of a dielectric liner. In one embodiment, the thickness of insulating layer 303a is approximately equal to the difference between the thickness of a conventional gate insulating layer (e.g., t1 in FIG. 2) and the desired thickness of the insulating layer at the bottom of the gate electrode (e.g., t2 in FIG. 2).

Figure 3C:
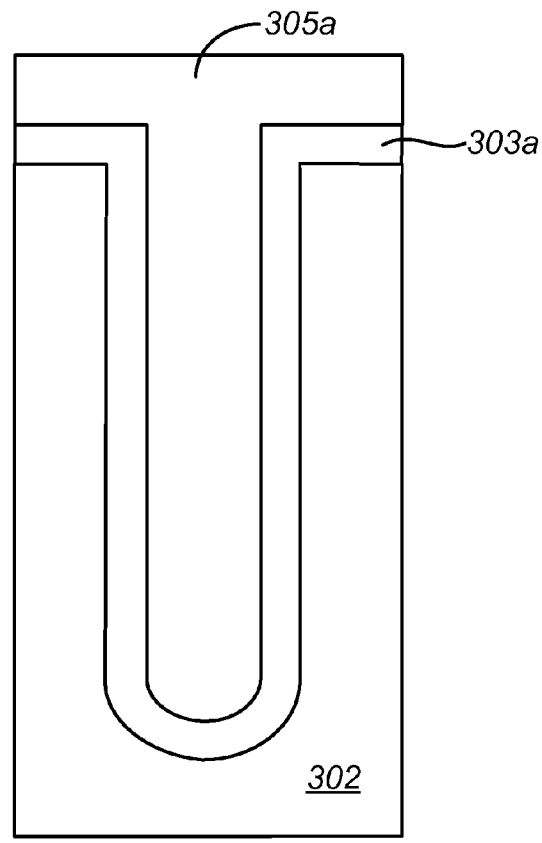

In FIG. 3C, the trench is filled with a material 305a that has a higher etch rate compared to insulating layer 303a. For example, fill material 305a may be any one of a number of different types of sacrificial films. Specific examples of fill material 305a would be deposited undensified silicon dioxide ($SiO_2$), borophosphosilicate glass (BPSG), phosphosilicate glass (PSG). The fill material needs to be uniform (i.e., have minimal voids and seams) to ensure uniform etching.

Figure 3D:
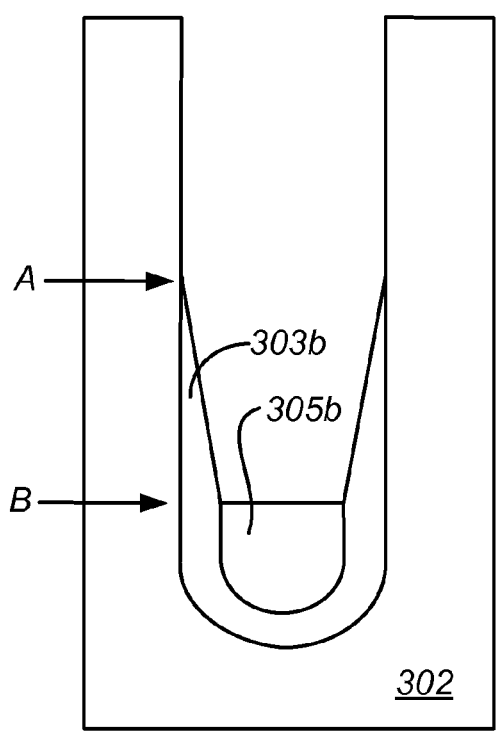

In FIG. 3D, both the fill material 305a and insulating layer 303a are isotropically etched (using wet or dry etch). With the fill material 305a etching faster than insulating layer 303a, the insulating layer 303a will gradually become exposed to the etchant from top-down as the fill material 305a is removed. After completion of the etch process, portion 303b of the insulating layer 303a remain along with bottom portion 305b of fill material 305a. The selection of the insulating layer 303a material, the fill material 305a, and the etch technique must be carefully considered to ensure that: (i) upon completion of the etch process, insulating layer 305a is completely removed from an upper portion of the trench sidewalls corresponding to the maximum doping concentration region in the channel region, and (ii) the slope along the exposed edge of insulting layer 303b, in view of the rate at which the doping concentration in the corresponding portion of the channel region drops, does not adversely affect the threshold voltage of the MOSFET. For example, if the fill material 305a has 6× etch rate of the insulating layer 303a, and the insulating layer 303a is about 500 Å thick, then the thickness of the resulting dielectric 303b will increase from 0 Å (at point A) to 500 Å (at point B) over a 3000 Å vertical distance.

Figure 4A:
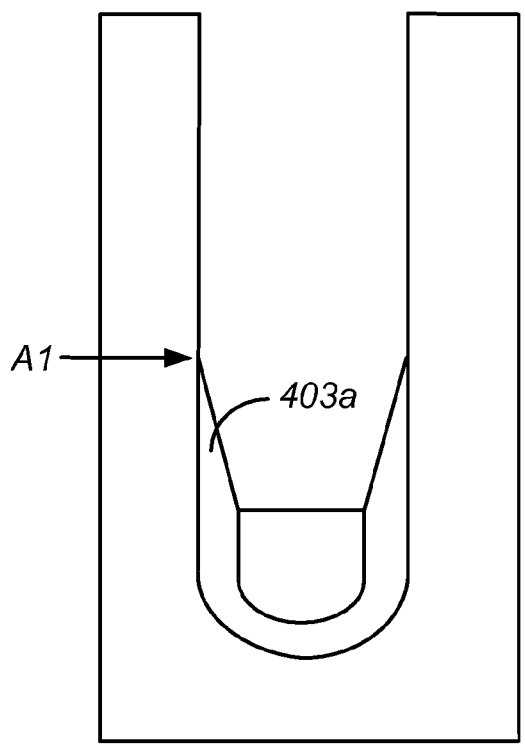
FIGS. 4A-4C shows the effect on the taper of the dielectric along the trench sidewalls with different ratios of etch rates.
Figure 4B:
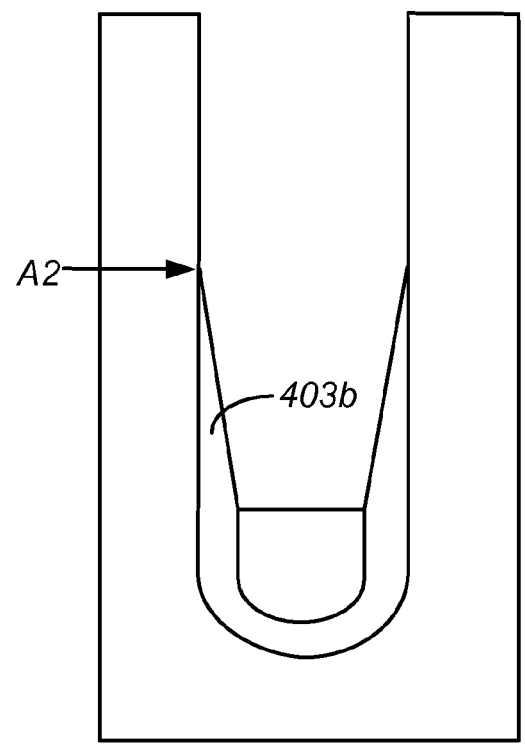
Figure 4C:
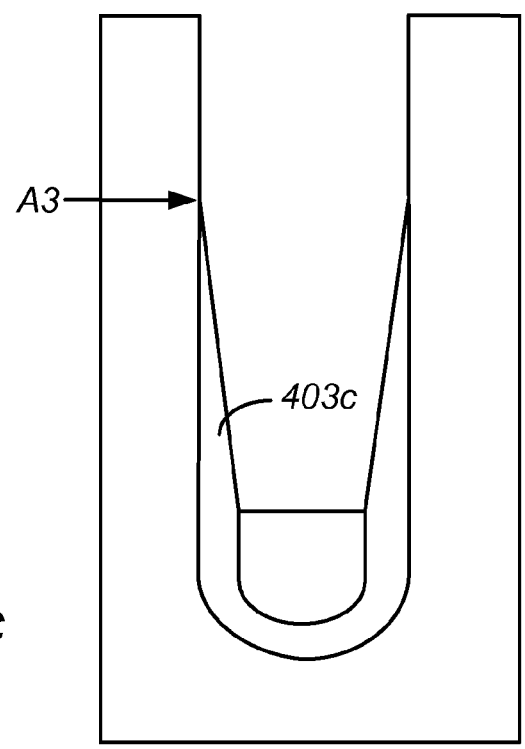

FIGS. 4A-4C show cross section views illustrating how the slope of the dielectric layer 403 may vary for three exemplary different etch rate ratios. FIG. 4A depicts the case where fill material 305a (FIG. 3c) has 4 times the etch rate of insulating layer 303a (FIG. 3C). FIG. 4B depicts the case where fill material 305a has 6 times the etch rate of insulating layer 303a, and FIG. 4C depicts the case where fill material 305a has 8 times the etch rate of insulating layer 303a. As can be seen, the higher the etch rate ratio, the shallower the slope of the dielectric layer 403 and the higher the point (i.e., points A1-A3) to which the dielectric layer 303a (FIG. 3C) is completely removed from along the trench sidewalls.

Figure 3E:
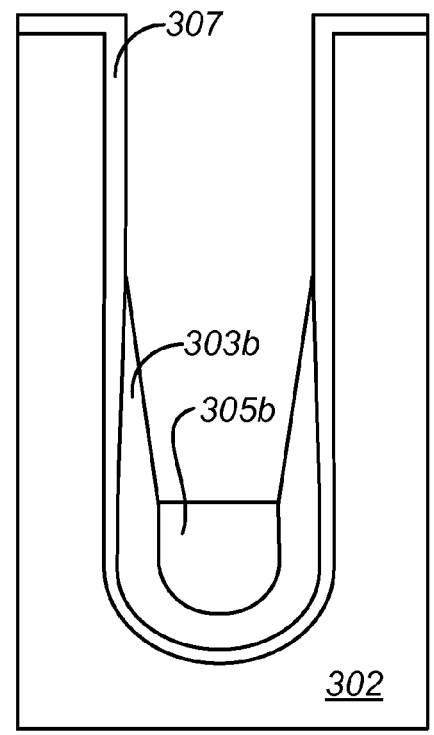

Referring to FIG. 3E, a conventional gate oxidation step is carried out to form gate oxide layer 307. The oxidation step results in growth of an insulating layer 307 having a uniform thickness along an upper portion of the trench sidewalls. Also, additional oxide growth takes place under insulating layer 303b. The thickness of the portion of insulating layer 307 underneath insulating layer 303b, depends on the thickness of the existing dielectric material and the material properties of the dielectric and fill material. Generally the thicker the existing dielectric, the less oxide is grown.

Figure 3F:
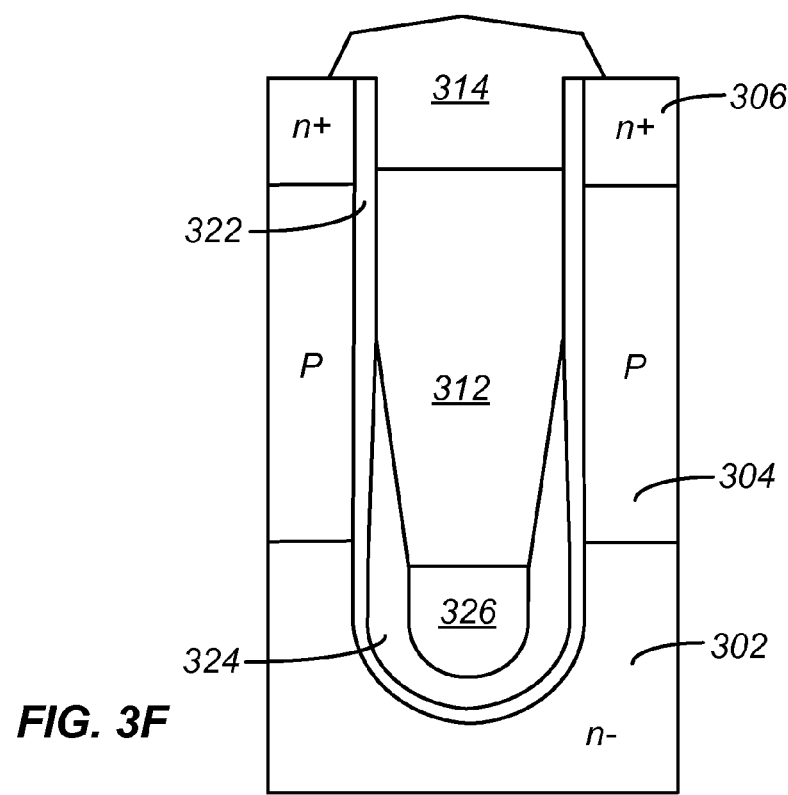

In FIG. 3F, well region 304 and source regions 306 are formed in epitaxial layer 302 using conventional ion implantation and annealing steps. Using known techniques, a recessed gate electrode 312 is formed in the trench, followed by an insulating material 314 capping the gate electrode 312. Well region 304 and source regions 306 may be formed at an earlier stage of the processing sequence than that shown in FIGS. 3A-3F. Source and drain metal layers (not shown) are respectively formed along the top-side and bottom-side of the structure. The source metal layer contacts source regions 306 and well region 304, and the drain metal layer contacts the substrate (not shown).

The above process sequence or portions thereof may be modified and integrated with other process sequences to obtain a lower Qgd. For example, the commonly assigned patent application titled "Structure and Method for Forming a Trench MOSFET having Self-Aligned Features," Ser. No. 10/442,670, filed on May 20, 2003, describes a process sequence for forming a trench gate MOSFET with self-aligned features, which application is incorporated herein by reference in its entirety. The process sequence depicted by FIGS. 2A-2K in the aforementioned application may be advantageously modified by incorporating the process module represented by FIG. 3A-3D of the present disclosure immediately after FIG. 2D of the aforementioned application.

The tapered gate dielectric technique of the present invention need not be combined with the thick-bottom-oxide (TBO) technique as illustrated in the figures of the present invention, although doing so yields a lower overall Qgd.

The cross-section views of the different embodiments may not be to scale, and as such are not intended to limit the possible variations in the layout design of the corresponding structures. Also, the various transistors can be formed in stripe or cellular architecture including hexagonal or square shaped transistor cells.

Although a number of specific embodiments are shown and described above, embodiments of the invention are not limited thereto. For example, it is understood that the doping polarities of the structures shown and described could be reversed to obtain p-channel FETs without departing from the invention. As another example, the trenches terminating in the epitaxial layer region 302 may alternatively terminate in the more heavily doped substrate (not shown in the figures). Therefore, the above description should not be taken as limiting the scope of the invention, which is defined by the appended claims.

What is claimed is:

1. A method of forming a field effect transistor, comprising:
   forming trenches in a semiconductor region of a first conductivity type;
   forming a well region of a second conductivity type in the semiconductor region;
   forming source regions of the first conductivity type in the well region such that channel regions defined by a spacing between the source regions and a bottom surface of the well region are formed in the well region along opposing sidewalls of the trenches;
   forming a gate dielectric layer having a non-uniform thickness along the opposing sidewalls of the trenches such that a variation in thickness of the gate dielectric layer along at least a lower portion of the channel regions is: (i) substantially linear, and (ii) inversely dependent on a variation in doping concentration in the lower portion of the channel regions; and
   forming a gate electrode in each trench.

2. The method of claim 1 wherein the variation in thickness of the gate dielectric layer is such that a conduction channel is formed in each channel region when the field effect transistor is in the on state.

3. The method of claim 1 wherein the variation in thickness of the gate dielectric layer does not increase a threshold voltage of the field effect transistor.

4. The method of claim 1 wherein the gate dielectric layer forming step further comprises:
   forming a first insulating layer along the opposing sidewalls of the trenches;
   filling each trench with a fill material having a higher etch rate than the first insulating layer;
   simultaneously etching the fill material and the first insulating layer such that: (i) an upper portion of the first insulating layer is completely removed from along an upper portion of the opposing sidewalls of the trenches and a remaining lower portion of the first insulating layer has a tapered edge, and (ii) a portion of the fill material remains in each trench; and forming a second insulating layer at least along upper portions of the opposing sidewalls of the trenches where the first insulating layer is completely removed.

5. The method of claim 4 wherein the fill material comprises a dielectric material.

6. The method of claim 1 wherein a doping concentration in the channel regions decreases from a maximum concentration in the direction from the source regions toward a bottom surface of the well region, and a thickness of the gate dielectric layer increases from a point below the maximum concentration in the direction from the source regions to the bottom surface of the well region.

7. The method of claim 1 wherein the semiconductor region includes an epitaxial layer of the first conductivity type extending over a substrate of the first conductivity type, the well region being formed in the epitaxial layer, and the trenches being formed so as to terminate below the bottom surface of the well region.

8. A method of forming a field effect transistor, comprising:
    forming trenches in a semiconductor region of a first conductivity type;
    forming a first insulating layer along opposing sidewalls of each trench;
    filling each trench with a dielectric fill material having a higher etch rate than the first insulating layer;
    simultaneously etching the dielectric fill material and the first insulating layer such that: (i) an upper portion of the first insulating layer is completely removed from along an upper portion of the opposing sidewall of each trench and a remaining lower portion of the first insulating layer has a tapered edge, and (ii) a portion of the dielectric fill material remains in each trench; and
    forming a second insulating layer at least along upper portions of the opposing sidewalls of each trench where the first insulating layer was completely removed.

9. The method of claim 8 further comprising:
    forming a gate electrode in each trench over the remaining dielectric fill material;
    forming a well region of a second conductivity type in the semiconductor region; and
    forming source regions of the first conductivity type in the well region.

10. The method of claim 9 wherein channel regions defined by a spacing between the source regions and a bottom surface of the well region extends in the well region along opposing sidewalls of each trench, and the first and second insulating layers together form a gate dielectric having a non-uniform thickness such that a variation in thickness of the gate dielectric along at least a lower portion of the channel regions is inversely dependent on a variation in doping concentration in the at least a lower portion of the channel regions.

11. The method of claim 10 wherein a doping concentration in the channel regions decreases from a maximum concentration in the direction from the source regions toward a bottom surface of the well region, and a thickness of the gate dielectric layer increases from a point below the maximum concentration in the direction from the source regions to the bottom surface of the well region.

12. The method of claim 9 wherein channel regions defined by a spacing between the source regions and a bottom surface of the well region extends in the well region along opposing sidewalls of each trench, and the first and second insulating layers together form a gate dielectric such that a thickness of the gate dielectric linearly increases from a first thickness at a point along the channel regions to a second thickness at a point below a bottom surface of the well region.

13. The method of claim 9 wherein the semiconductor region includes an epitaxial layer of the first conductivity type extending over a substrate of the first conductivity type, the well region being formed in the epitaxial layer, and the trenches being formed so as to terminate below a bottom surface of the well region.

14. A method of forming a field effect transistor, comprising:
    forming trenches in a semiconductor region of a first conductivity type;
    forming a well region of a second conductivity type in the semiconductor region;
    forming source regions of the first conductivity type in the well region such that channel regions defined by a spacing between the source regions and a bottom surface of the well region are formed in the well region along opposing sidewalls of the trenches, and a doping concentration in the channel regions decreases from a maximum concentration in the direction from the source regions toward a bottom surface of the well region;
    forming a gate dielectric layer having a non-uniform thickness along the opposing sidewalls of the trenches such that a thickness of the gate dielectric layer increases in a substantially linear manner from a point below the maximum concentration in the direction from the source regions to the bottom surface of the well region; and
    forming a gate electrode in each trench.

15. The method of claim 14 wherein a variation in thickness of the gate dielectric layer is such that a conduction channel is formed in each channel region when the field effect transistor is in the on state.

16. The method of claim 14 wherein a variation in thickness of the gate dielectric layer does not increase a threshold voltage of the field effect transistor.

17. The method of claim 14 wherein the gate dielectric layer forming step further comprises:
    forming a first insulating layer along the opposing sidewalls of the trenches;
    filling each trench with a fill material having a higher etch rate than the first insulating layer;
    simultaneously etching the fill material and the first insulating layer such that: (i) an upper portion of the first insulating layer is completely removed from along an upper portion of the opposing sidewalls of the trenches and a remaining lower portion of the first insulating layer has a tapered edge, and (ii) a portion of the fill material remains in each trench; and
    forming a second insulating layer at least along upper portions of the opposing sidewalls of the trenches where the first insulating layer is completely removed.

18. The method of claim 17 wherein the fill material comprises a dielectric material.

19. The method of claim 17 wherein the semiconductor region includes an epitaxial layer of the first conductivity type extending over a substrate of the first conductivity type, the well region being formed in the epitaxial layer, and the trenches being formed so as to terminate below the bottom surface of the well region.

* * * * *